(12) United States Patent
Deo et al.

(10) Patent No.: US 8,902,554 B1
(45) Date of Patent: Dec. 2, 2014

(54) OVER-VOLTAGE TOLERANT CIRCUIT AND METHOD

(71) Applicant: Cypress Semiconductor Corporation, San Jose, CA (US)

(72) Inventors: Supreet Bhanja Deo, Bangalore (IN); Timothy Williams, Bellevue, WA (US); Pat Madden, Sunol, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 12 days.

(21) Appl. No.: 14/037,023

(22) Filed: Sep. 25, 2013

Related U.S. Application Data

(60) Provisional application No. 61/834,061, filed on Jun. 12, 2013.

(51) Int. Cl.
  *H02H 3/20* (2006.01)
  *H03K 17/08* (2006.01)
(52) U.S. Cl.
  CPC ..................................... *H03K 17/08* (2013.01)
  USPC ....................................................... 361/91.1
(58) Field of Classification Search
  CPC .......... H03K 19/00315; H03K 17/167; H03K 19/01721; H03K 19/01742
  USPC ....................................................... 361/91.1
  See application file for complete search history.

(56) References Cited

U.S. PATENT DOCUMENTS

| | | | |
|---|---|---|---|
| 4,140,927 A | 2/1979 | Feucht | |
| 5,966,036 A * | 10/1999 | Hoff et al. | 327/112 |
| 6,781,416 B1 * | 8/2004 | Nguyen et al. | 326/83 |
| 7,015,721 B2 * | 3/2006 | Nguyen et al. | 326/83 |
| 7,348,803 B2 | 3/2008 | Bui et al. | |
| 8,542,847 B2 * | 9/2013 | Shajaan et al. | 381/111 |
| 2004/0174646 A1 * | 9/2004 | Ko | 361/56 |
| 2004/0255193 A1 | 12/2004 | Larson et al. | |
| 2006/0066355 A1 * | 3/2006 | Gosmain et al. | 326/87 |
| 2006/0139058 A1 * | 6/2006 | Maxwell | 326/58 |

FOREIGN PATENT DOCUMENTS

| | | |
|---|---|---|
| CN | 102629241 | 8/2012 |
| EP | 1382119 | 10/2006 |

OTHER PUBLICATIONS

Mark Overgaard,The quickest way to a compliant and interoperable Intelligent Platform Management Controller for AdvancedTCA, CompactPCI Systems, Apr. 2004, Scotts Valley, CA, U.S.A.
Linear Technology Corporation, LTC4280 Hot Swap Controller with I2C Compatible Monitoring User Guide, 2010, Milpitas, CA U.S.A.

(Continued)

*Primary Examiner* — Rexford Barnie
*Assistant Examiner* — Angela Brooks

(57) ABSTRACT

Over-voltage tolerant circuits and methods are provided. In one embodiment, the circuit includes a pull-up transistor coupled to an I/O pad, a sensing circuit coupled to the I/O pad and to a voltage supply (Vcc), the sensing circuit configured to sense a voltage applied to the pad (Vpad), a latch coupled to the sensing circuit to retain an output of the sensing circuit, and a selection circuit coupled to the sensing circuit through the latch. The selection circuit includes a first bias circuit to apply Vcc to a well and gate of the pull-up transistor, a second bias circuit to apply Vpad to the gate and the well of the pull-up transistor, and a non-overlap circuit configured to ensure the gate and the well of the pull-up transistor is substantially always driven by either the first or the second bias circuit depending on the output of the sensing circuit.

17 Claims, 6 Drawing Sheets

(56) References Cited

OTHER PUBLICATIONS

Texas Instruments, 36-V Hotswap Controller with Precision I2C Power Monitoring User Guide, Oct. 2011, Dallas, Texas U.S.A.

Analog Devices, Hot Swap and Power Monitoring Applications Bulletin, Jun. 2007, Norwood, MA, U.S.A.
"Hot Swap Controller and I2C Power Monitor", ADM1176, Analog Devices, Revision B dated Feb. 2008; 24 pages.

* cited by examiner

OVER-VOLTAGE TOLERANT CIRCUIT AND METHOD

CROSS-REFERENCE TO RELATED APPLICATIONS

This application claims the benefit of U.S. Provisional Application No. 61/834,061, filed on Jun. 12, 2013, which is incorporated by reference herein.

TECHNICAL FIELD

This disclosure relates to the field of electronic circuits and more particularly to over-voltage tolerant circuits and methods.

BACKGROUND

There are several circumstances in which a circuit or electronic device may experience may experience voltages higher than the connected supply voltage. For example, a hot-swap is an operation to add or remove a circuit or electronic device from an already powered system, normally without disturbing the rest of the system. This may cause some I/O to connect to powered signals in the system before the device is connected to a power supply. In some applications, such as inter-integrated circuit (I²C) communication, coupling of integrated circuits (ICs) that run at different supply voltages can cause input/output (I/O) pads of the IC or device to connect to a higher voltage than a supply voltage of the IC or device, potentially damaging the device or causing excessive loading or leakage currents in some I/O. Such excessive current leakage through the I/O pad can adversely impact signals on the I²C bus. In addition, when a device is connected to a system and power to the system is turned on or turned off, there may be voltages on I/O pins of the device that are higher than the supply during either a turning-on transition, a turning-off transition, or when the power is stably off. Thus, a hot-swap or over-voltage tolerant circuit is desirable to enable the IC or device to be connected to a system, or to other ICs and devices, while the system is powered, without risk of damage to the IC or the system, without excessive leakage, and without interruption of communication.

One such circuit is illustrated in FIG. 1A. Referring to FIG. 1A, the hot-swap circuit 100 typically includes a pull-up p-channel metal-oxide-semiconductor field effect transistor (PMOS 102) formed in an n-well and coupled to the I/O pad 104, an n-well selection circuit 106, a sensing circuit 108, and a latch 110 configured to retain a state of the sensing circuit, the latch coupled to the sensing circuit and the n-well selection circuit through a PMOS drive circuit 112. The n-well node, labeled vpb_drvr in FIG. 1A, of the pull-up PMOS 102 is driven by PMOS transistors P1 and P2 in the n-well selection circuit 106 such that vpb_drvr is connected to either a supply voltage (Vcc) or a voltage applied to the pad (Vpad), depending on Vpad. Typically, vpb_drvr is also indirectly connected to a gate of the pull-up PMOS 102 through a gate drive 114. In certain non-I²C applications the gate drive 114 may be further connected to a control circuit to turn the pull-up PMOS on or off when it is not used.

FIG. 1B, illustrates the I/O pad voltage, n-well resistance and the latch state during example operation of the circuit of FIG. 1A. Referring to FIG. 1B, the I/O pad voltage may rise from a ground voltage (Vgnd) to Vcc−Vtp, where Vtp is a threshold voltage of the PMOS transistors P1 and P2. During this time sense transistor P3 is ON and sense transistor P4 is OFF, and the latch 110 is in a normal state, which forces the gate of transistor P1 to Vgnd, turning it ON. Transistor P2 is OFF because Vpad is lower than Vcc, and hence the n-well node, vpb_drvr, of the pull-up PMOS is connected to Vcc. During a second time period the I/O pad voltage is rising from Vcc−Vtp to Vcc+Vtp. Both sense transistors P3 and P4 are OFF while the latch 110 retains the normal state and drives gate of transistor P1 to Vgnd. Transistor P2 is OFF and hence vpb_drvr is connected to Vcc. During a third time period the I/O pad voltage is rising from Vcc+Vtp to an external voltage (Vext) coupled to the I/O pad 104 and then falling back to Vcc+Vtp. The sense transistor P4 turns ON while sense transistor P3 is OFF, which forces the latch 110 into a hot-swap state. The flipped latch 110 drives the gate of transistor P1 high turning it OFF, transistor P2 is automatically turned ON as the I/O pad 104 rises above transistor P2's gate voltage and hence vpb_drvr is connected to the I/O pad external voltage (Vext). Finally, in a fourth time period the pad voltage is falling first from Vcc+Vtp to Vcc−Vtp. Both sense transistors P3 and P4 are OFF. Latch 110 remains in the hot-swap state and drives gate of transistor P1 high turning it OFF, while transistor P2 is also automatically turned OFF, and hence vpb_drvr is neither connected to Vcc nor to the pad voltage (Vext). Thus, the n-well of the pull-up PMOS 102 floats when the I/O pad 104 is within a Vtp of Vcc as the pad voltage falls from a voltage above Vcc+Vtp. During this period in which the n-well of the pull-up PMOS 102 is floating, commonly called a dead-zone, the risk of latch-up and associated device malfunction and interruption in communication is high. As shown in the N-well drive resistance plot at the bottom of FIG. 1B, the resistance of the N-well connection varies with the pad voltage. When the resistance is high, the risk of latch-up is increased. Although the turn-on and turn-off of P1 and P2 has been described as changing abruptly at Vcc−Vtp and Vcc+Vtp, but in actual operation these changes will have a gradual transition and the effective on resistance of P1 and P2 will vary as the voltage varies.

SUMMARY

The hot-swap circuits and methods of the present disclosure reduces or eliminates completely the dead-zone, thereby substantially eliminating the risk of latch-up, any associated device malfunction including interruption in communication.

In one embodiment, the over-voltage tolerant circuit includes a pull-up transistor coupled to an I/O pad, a sensing circuit coupled to the I/O pad and to a voltage supply (Vcc), the sensing circuit configured to sense a voltage applied to the pad (Vpad), a latch coupled to the sensing circuit to retain an output of the sensing circuit, and a selection circuit coupled to the sensing circuit through the latch. The selection circuit includes a first bias circuit to apply Vcc to a well and, indirectly, to the gate of the pull-up transistor, a second bias circuit to apply Vpad to the well and, indirectly, to the gate of the pull-up transistor, and a non-overlap circuit configured to ensure the well of the pull-up transistor is substantially always driven by either the first or the second bias circuit depending on the output of the sensing circuit.

BRIEF DESCRIPTION OF THE DRAWINGS

The present disclosure is illustrated by way of example, and not by way of limitation, in the figures of the accompanying drawings.

DETAILED DESCRIPTION

Over-voltage tolerant circuits and methods are described herein. The circuit and method are particularly useful for preventing input/output (I/O) pad leakage and providing uninterrupted communication on a bus such as an inter-integrated circuit ($I^2C$) bus, when an integrated circuit (IC) including the over-voltage tolerant circuit connected to the $I^2C$ bus is powered up or down. In particular, a large leakage current from an I/O pad of a complementary metal-oxide-semiconductor (CMOS) circuit may arise as a result of an overvoltage condition where I/O pad voltage is higher than the supply voltage. Additionally, the CMOS circuit can become vulnerable to latch up when a well of a transistor in a pull-up driver coupled to the I/O pad is left in a high resistance state for more than a brief time, which can occur as a result of the overvoltage condition. Both of these phenomena can result in malfunction or destruction of the circuit.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term to couple as used herein may include both to directly electrically connect two or more components or elements and to indirectly connect through one or more intervening components.

Figure 2:
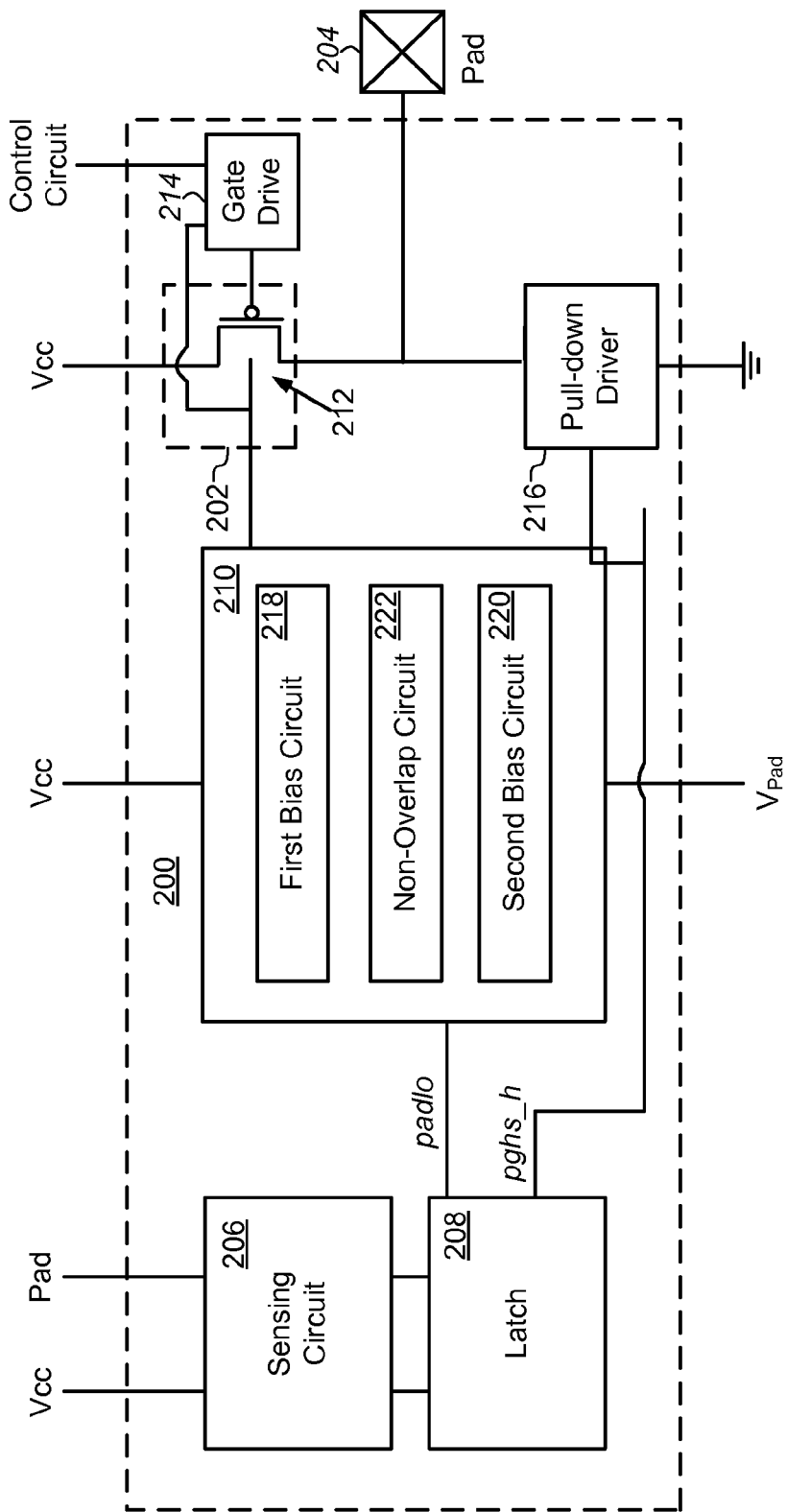
FIG. 2 is a block diagram illustrating an embodiment of a hot-swap circuit including a non-overlap circuit according to the present disclosure.

One embodiment of a hot-swap or over-voltage tolerant circuit 200 according to the present disclosure is illustrated in the block diagram of FIG. 2. Generally, the over-voltage tolerant circuit 200 is fabricated using CMOS technology in a common substrate or semiconductor layer with an I/O pad 204 of an electronic device (not shown in this figure). Referring to FIG. 2, the over-voltage tolerant circuit 200 generally includes a pull-up driver 202 coupled to the I/O pad 204 of the electronic device, a sensing circuit 206 coupled to the I/O pad and to a voltage supply (Vcc), a latch 208 coupled to the sensing circuit and a selection circuit 210 coupled to the sensing circuit through the latch. The pull-up driver 202 includes at least one pull-up transistor 212 formed in a well in the substrate (not shown in this figure). In certain embodiments, such as that shown, the pull-up transistor 212 includes a P-type MOS (PMOS) transistor fabricated in an N-Well formed in P-type substrate or semiconductor layer.

The sensing circuit 206 is configured to sense a voltage (Vpad) at the I/O pad 204. The latch 208 is configured to retain an output of the sensing circuit, and to couple a p-gate hot-swap or more simply a gate hot-swap (pghs_h) signal indicating a high voltage on the I/O pad (Vpad) greater than Vcc, and/or a pad low voltage signal (padlo) indicating a voltage on the I/O pad (Vpad) less than Vcc to the selection circuit 210. By hot-swap signal or pghs_h it is meant a signal indicating an over-voltage condition has been sensed on the I/O pad 204. It will be understood that as noted above this over-voltage condition can be the result of a hot-swap operation or a system to which the I/O pad of the electronic device is coupled being turned on or off. The selection circuit 210 is configured to apply a bias to the well and, indirectly, to the gate of the pull-up transistor 212 to prevent an undesirably large leakage current from the I/O pad 204 and also to provide a low resistance connection to the well that otherwise may result in latch up vulnerability of the electronic device in which the over-voltage tolerant circuit 200 is included, or in an already powered system (not shown) or separate device to which the electronic device is being added or removed.

Generally, as in the embodiment shown and as noted above the gate of the pull-up transistor 212 is indirectly coupled to the selection circuit 210 through a gate drive 214. The gate drive 214 operated by control signal from a control circuit (not shown) to enable the pull-up transistor 212 to be turned on or off in certain applications, such as non-$I^2C$ applications or when the electronic device is not coupled or connected to an $I^2C$ bus.

Optionally, the over-voltage tolerant circuit 200 further includes a pull-down driver 216 coupled between the I/O pad 204 of the electronic device and a circuit ground (Vgnd) to reduce I/O pad leakage during power-up or power-down of the device. Typically, the pull-down driver 216 includes at least one pull-down transistor (not shown in this figure). One problem with conventional pull-down drivers is that when an external $I^2C$ pull-up supply (Vext) is applied to the I/O pad 204 and the device is unpowered, a gate of the pull-down transistor may not be strongly driven, so that the gate of the pull-down transistor can capacitively couple to the I/O pad. As a result, the gate voltage the of the pull-down transistor, normally held low during power-up or power-down of the pull-down transistor by a CMOS logic pre-driver to place the I/O pad 204 in a high impedance mode, can rise due to the capacitive coupling and weakly turn ON the pull-down transistor. This in turn causes I/O pad 204 loading, and hence undesired $I^2C$ bus distortion.

In contrast to conventional pull-down drivers, the pull-down driver 216 of the present disclosure is driven during power-up or power-down of the device by an existing pghs_h signal in the over-voltage tolerant circuit 200 to drive the gate of pull-down transistor to Vgnd, thus overriding the capacitive coupling between I/O pad 204 and gate of the pull-down transistor, thereby eliminating I/O pad loading, and undesired $I^2C$ bus distortion. Details of the pull-down driver 216 will be described below in greater detail with reference to FIGS. 5A and 5B.

Referring again to FIG. 2, the selection circuit 210 includes a first bias circuit 218 configured to apply Vcc to the well and, indirectly, to the gate of the pull-up transistor 212, a second bias circuit 220 configured to apply Vpad to the well and, indirectly, to the gate of the pull-up transistor, and a non-overlap circuit 222 configured to ensure the well and gate of the pull-up transistor is substantially always driven by either the first or the second bias circuit depending on the output of the sensing circuit 206. By substantially always it is meant a time during which the well and gate of the pull-up transistor is not driven by either the first or the second bias circuit is less than about 10 microseconds (μs), and more preferably less than about 10 nanoseconds (ns). Because the well and gate of the pull-up transistor 212 is substantially always driven, a dead-zone when the I/O pad 204 is within a threshold voltage of the PMOS transistors (Vtp) of Vcc is reduced or eliminated completely, thereby substantially eliminating the risk of latch-up in the electronic device including the over-voltage tolerant circuit 200, and the consequent malfunction and interruption in communication.

Figure 3:
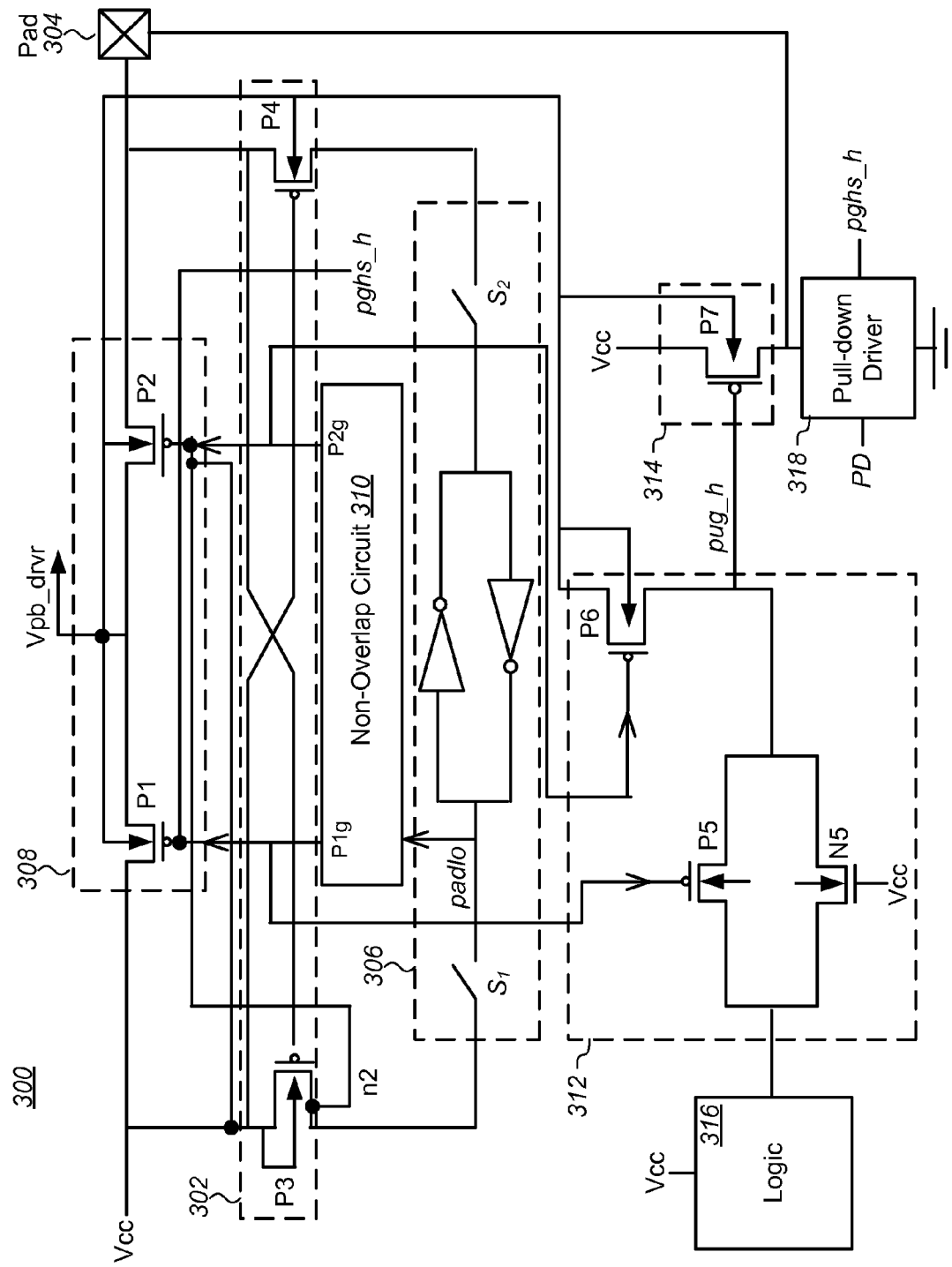
FIG. 3 is a schematic diagram illustrating an embodiment of a hot-swap circuit including a non-overlap circuit according to the present disclosure.

An embodiment of an over-voltage tolerant circuit including a non-overlap circuit according to the present disclosure will now be described in greater detail with reference to the schematic diagram of FIG. 3. Referring to FIG. 3, the over-voltage tolerant circuit 300 includes a sensing circuit 302 coupled to an I/O pad 304 and to a voltage supply (Vcc), a latch 306 coupled to the sensing circuit, a selection circuit 308 coupled to the sensing circuit through the latch, and a non-overlap circuit 310 coupled to the latch and the selection circuit.

Generally, as in the embodiment shown, the over-voltage tolerant circuit 300 further includes a gate drive 312 or interface circuitry to interface between a pull-up driver 314 and the rest of the over-voltage tolerant circuit 300, and logic block or logic 316 to drive or control the pull-up driver 314 in applications that do not experience hot-swap or over-voltage conditions. The logic 316 provides an output that is low to turn on the pull-up driver 314, and high to turn it off. In over-voltage applications such as I²C, the pull-up driver 314 is turned off and the logic 316 output drives high at Vcc. Transistors P5 and N5 in the gate drive 312 function as a switch to enable logic 316 to output or pass Vcc to a gate of a pull-up transistor P7 in the pull-up driver 314 in normal operation but to block it in over-voltage conditions, so that the pull-up driver's input can rise above Vcc. Device P6 couples between vpb_drvr and the gate of the pull-up transistor P7 in the pull-up driver 314 to provide a pull-up gate hot-swap (pug_h) signal. P6 is turned on when the P2 device turns on. This allows pug_h to rise to vpb_drvr which will be at Vpad, which can be a higher voltage than the supply voltage Vcc.

The over-voltage tolerant circuit 300 further includes a pull-down driver 318 coupled between the I/O pad 304 of the electronic device and a circuit ground (Vgnd) to reduce I/O pad leakage during power-up or power-down of the device. Typically, the pull-down driver 318 includes at least one pull-down transistor (not shown in this figure). Details of the pull-down driver 318 will be described below in greater detail with reference to FIGS. 5A and 5B.

The sensing circuit 302 includes cross-coupled first and second sense transistors, P3 and P4 respectively. In some embodiments, such as that shown, sense transistors P3 and P4 are PMOS transistors. The selection circuit 308 includes first and second select transistors, P1 and P2 respectively. In some embodiments, such as that shown, sense transistor P1 is a PMOS transistor with a gate connected to the Non-Overlap Circuit 310 and to the gate drive 312, and sense transistor P2 is also a PMOS transistor with a gate connected to Vcc and to the Non-Overlap Circuit 310. The sensing circuit 302 monitors the I/O pad 304 constantly and updates the state of latch 306, which in turn signals the non-overlap circuit 310 through a pad low voltage (padlo) signal. As in the embodiment shown, the latch 306 may be connected to the sense transistors 302 through switches, $S_1$ and $S_2$, that toggle such that the latch only receives input from the sense transistor that can change the latch state. The Non-Overlap Circuit 310 generates one of two mutually exclusive signals, P1g and P2g, which ensures that either select transistor P1 or P2 is substantially always turned ON and hence the at-risk N-well of a PMOS pull-up transistor in a pull-up driver (not shown in this figure) is substantially always driven by relatively low impedance.

In particular, when the I/O pad 304 is rising from Vgnd to Vcc−Vtp sense transistor P3 is ON and while Vcc is applied to a gate of sense transistor P4 forcing it OFF, the latch 306 is in a normal state, and the non-overlap circuit 310 outputs a P1g signal to a gate of the select transistor P1 turning it ON while select transistor P2 remains off, and hence coupling output node vpb_drvr to Vcc, connecting a gate and the N-well of the PMOS pull-up transistor to Vcc.

When the I/O pad 304 is rising from Vcc−Vtp to Vcc+Vtp both sense transistors P3 and P4 are OFF. However, the latch 306 retains the normal state, and the non-overlap circuit 310 continues to output the P1g signal to the gate of the select transistor P1 maintaining it ON while select transistor P2 remains off, and hence coupling output node vpb_drvr to Vcc.

When the I/O pad 304 is rising from Vcc+Vtp to a higher external I/O pad voltage (Vext) and then falling back to Vcc+Vtp, sense transistor P4 turns ON while P3 is OFF, forcing the latch 306 into a hot-swap state, signaling the non-overlap circuit 310 to assert the P2g signal to a gate of the select transistor P2 turning it ON while select transistor P1 turns off, and hence coupling output node vpb_drvr to a voltage on the I/O pad 304 (Vpad), and connecting the N-well and, indirectly, the gate of the PMOS pull-up transistor to Vpad.

Figure 1A:
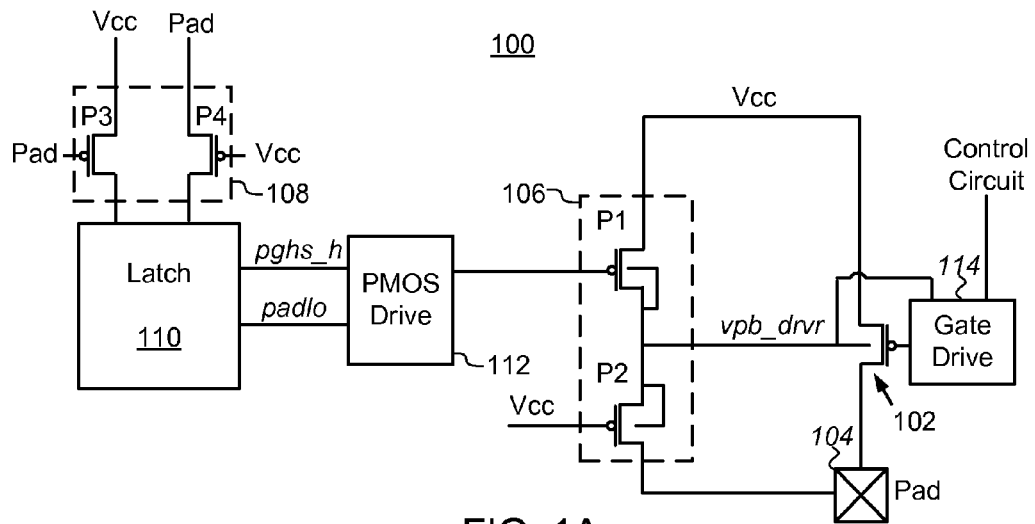
FIG. 1A is a block diagram illustrating conventional hot-swap circuit.
Figure 1B:
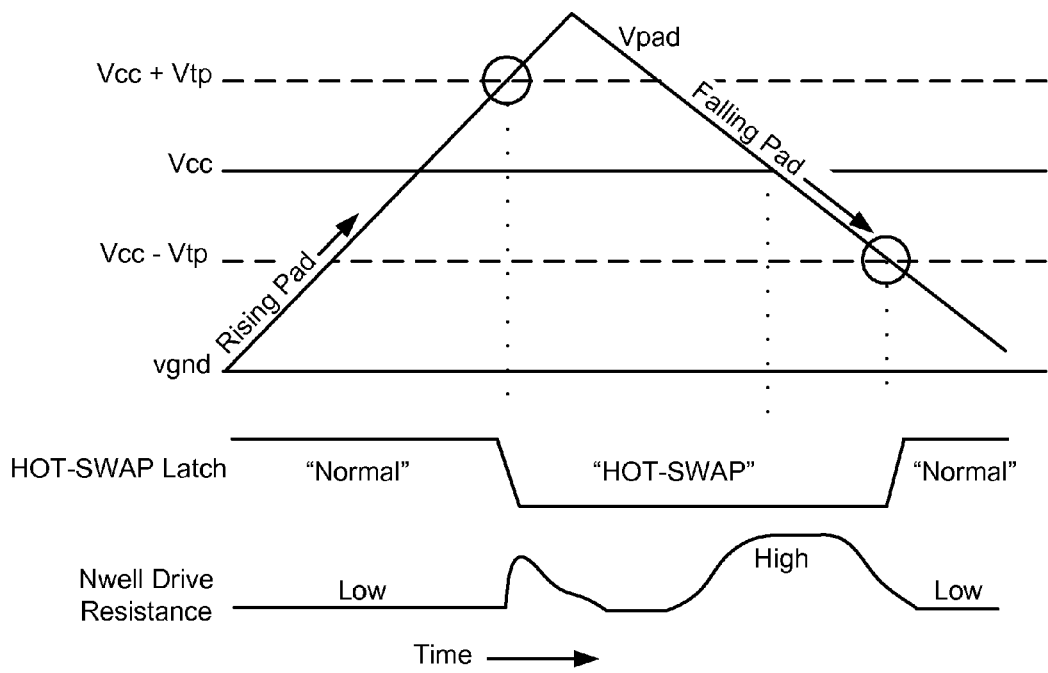
FIG. 1B illustrates a pad voltage, n-well resistance and latch state during operation of the circuit of FIG. 1A.

In a conventional hot-swap circuit 100, such as described above with reference to FIG. 1, as the voltage on the I/O pad 104 continues falling from Vcc+Vtp to Vcc−Vtp both sense transistors P3 and P4 are OFF, and select transistor P2 automatically turned OFF as Vpad drops below the P2 gate signal. The latch 110 retains the hot-swap state and drives the gate of select transistor P1 to high thus also turning it OFF, with the undesirable result that node vpb_drvr is neither connected to Vcc nor to Vpad with a low resistance, causing the N-well and, indirectly, the gate of the PMOS pull-up transistor to float, resulting in the risk of latch-up of the electronic device, the consequent malfunction and possible interruption in communication on an I²C bus to which the I/O pad 104 is connected.

In contrast, in the over-voltage tolerant circuit 300 of FIG. 3, the non-overlap circuit 310 continues to output the P2g signal to the gate of the select transistor P2 maintaining it ON until Vpad goes below Vcc−Vtp to change the latch state, discontinuing or removing the P2g signal to the gate of the select transistor P2 turning it OFF and asserting the P1g signal to the gate of the select transistor P1 turning it ON. Thus, the N-well and, indirectly, the gate of the PMOS pull-up transistor P7 are substantially always driven by a relatively low impedance, reducing if not eliminating entirely the float or the dead zone described above, thereby removing in the risk of latch-up of the electronic device, avoiding associated malfunction and interruption in communication on an I²C bus to which the I/O pad 304 is connected.

Figure 4:
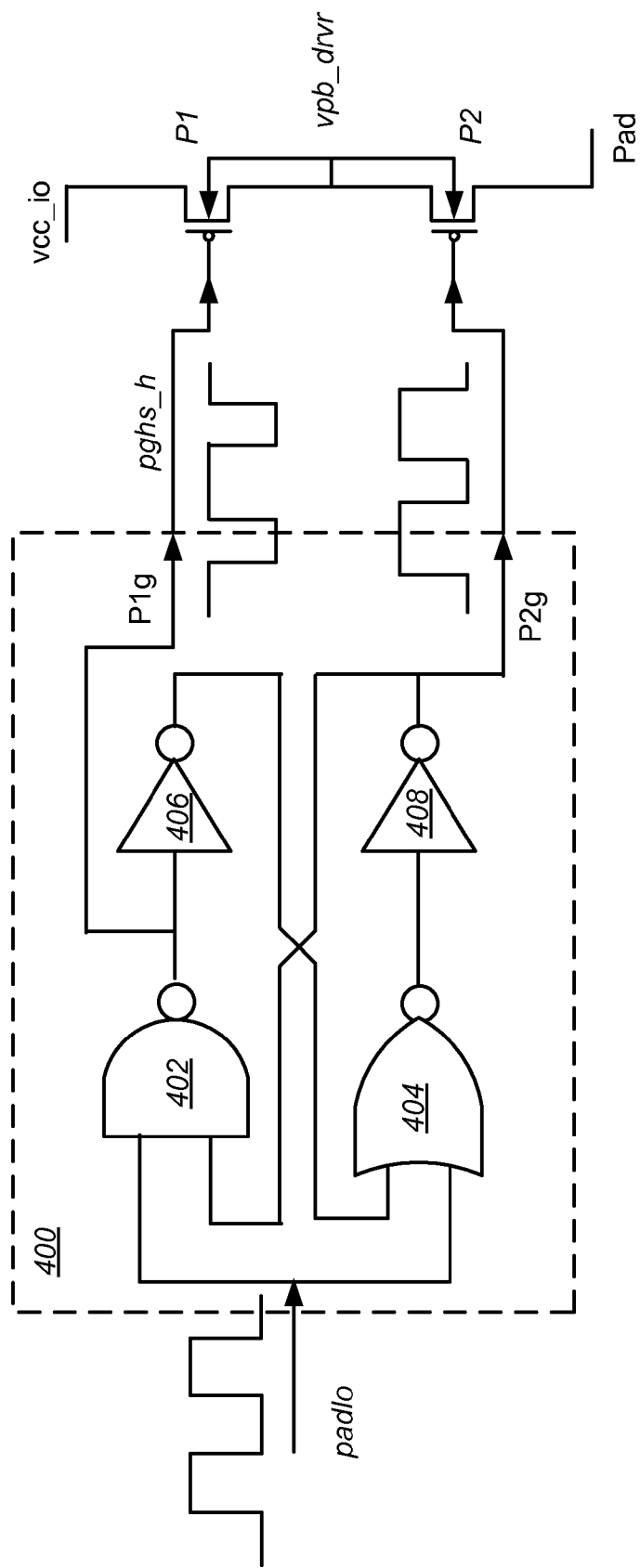
FIG. 4 is a schematic block diagram illustrating an embodiment of a non-overlap circuit according to the present disclosure.

An embodiment of a non-overlap circuit according to the present disclosure will now be described in greater detail with reference to the schematic diagram of FIG. 4. Referring to FIG. 4, in one embodiment the non-overlap circuit 400 includes a dual input nand gate 402 and a dual input nor gate 404, each having a first cross-coupled input coupled to the output of the other through first or second inverters 406, 408, and a second input coupled to the latch (not shown in this figure) to receive a padlo signal therefrom and to generate P1g and P2g signals as appropriate. When the latch is in the hot-swap state, the padlo signal on the second input of nand gate 402 is low and outputs a high P1g signal, turning off select transistor P1. At substantially the same time nor gate 404 receives on the first input an inverted P1g signal, a logic 0, so nor gate 404 output is high, inverter 408 output is low, and signal P2g is low, turning on select transistor P2, coupling the vpb_drvr to Vpad. When the latch is no longer in the hot-swap state, the padlo signal on the second input of nor gate 404 goes high and nor gate 404 outputs a low and signal P2g, the output of inverter 408, goes high turning off the select transistor P2. Immediately or shortly thereafter nand gate 402 receiving high signal on both inputs, i.e., a high padlo signal and a high P2g signal, outputs a logic 0, which generates a low P1g signal, turning on select transistor P1 and coupling the vpb_drvr to Vcc.

Because generation of the two signals P1g and P2g are mutually exclusive, it is ensured that one and only one of select transistor P1 or P2 is turned ON and hence the at-risk N-well of a PMOS pull-up transistor in a pull-up driver (not shown in this figure) is always driven by a relatively low impedance. Because of time delays arising from propagation of the signals through the nand gate 402, the nor gate 404, and inverters 406, 408, there is a non-overlap time is on the order of several nanoseconds (ns). As noted above, this non-overlap time can be 10 ns or less and is short enough to not introduce a significant risk of latch-up.

In another aspect, a pull-down driver circuit is provided to reduce a gate-pad coupling of transistors in the pull-down driver circuit and hence reduce I/O pad leakage during power-up or power-down of the I/O pad. Embodiments of a pull-down driver circuit according to the present disclosure will now be described in greater detail with reference to the schematic diagram of FIGS. 5A and 5B.

Figure 5B:
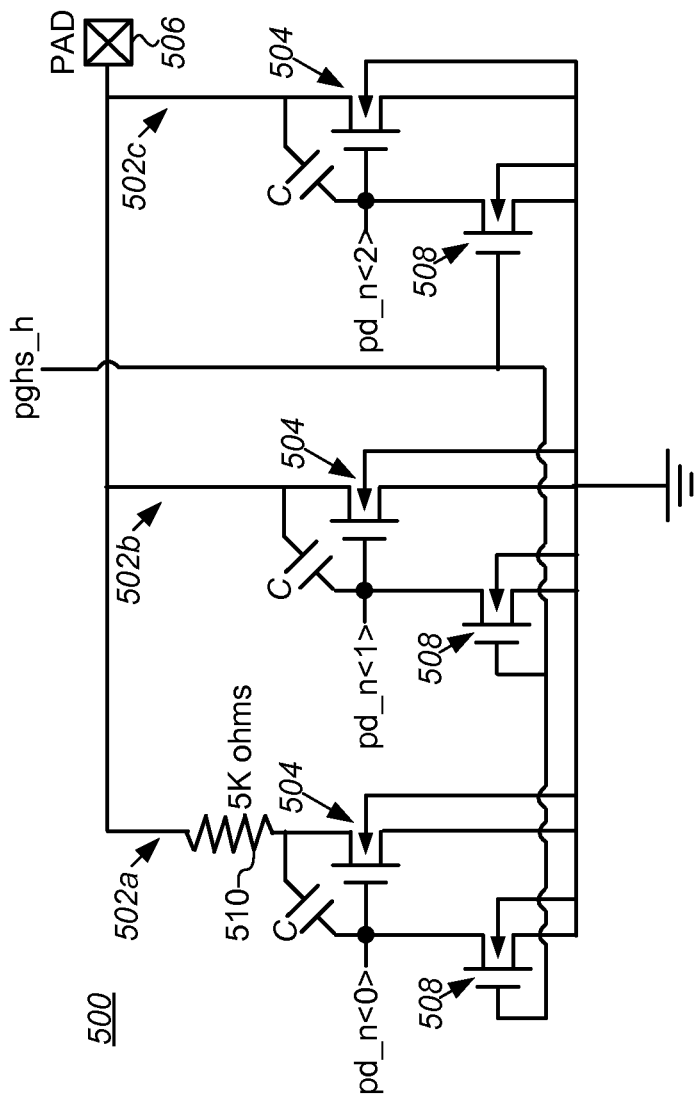
FIGS. 5A and 5B are schematic block diagrams illustrating embodiments of a pull-down driver circuit according to the present disclosure to reduce the gate-pad coupling and hence reduce I/O pad leakage during power-up or power-down of the I/O pad.
Figure 5A:
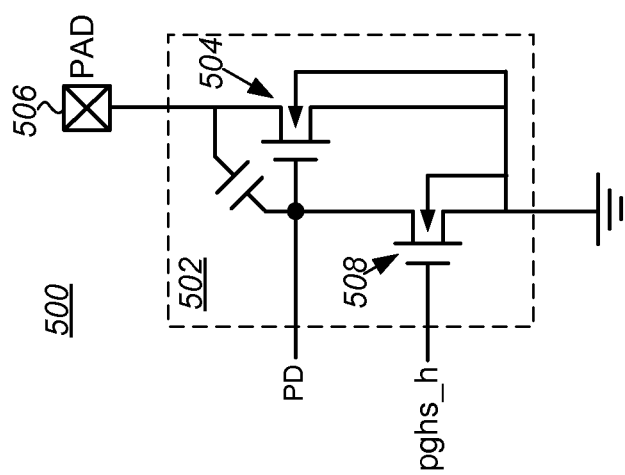

Referring to FIG. 5A, in one embodiment the pull-down driver circuit 500 includes at least one leg 502 including a N-type MOS (NMOS) pull-down transistor 504 coupled between the I/O pad 506 and a circuit ground. A pull-down signal (PD) applied to a gate of the NMOS pull-down transistor 504 from a logic pre-driver or block, such as logic 316 in FIG. 3, places the I/O pad in a high impedance mode. As noted above one problem with conventional pull-down drivers is that when an external I²C pull-up supply (Vext) is applied to the I/O pad 506 and the device is unpowered, the gate of the pull-down transistor 504 may not be strongly driven, and can capacitively couple to the I/O 506 pad through a parasitic capacitor C. As a result, a gate voltage of the pull-down transistor 504, normally held low during power-up or power-down, can rise weakly turning ON the pull-down transistor, and causing I/O pad 506 loading and I²C bus distortion. However, in the embodiment shown in FIG. 5A each leg 502 of the pull-down circuit 500 further includes a second NMOS transistor 508 coupled between the gate of the pull-down transistor 504 and circuit ground and configured to receive a pghs_h signal from an over-voltage tolerant circuit, such as described above with respect to FIG. 2 or 3, to drive the gate of the NMOS pull-down transistor low enough that any coupling from the I/O PAD does not turn on devices 504 sufficiently to cause excessive I/O leakage that could otherwise occur when the PAD voltage is being driven high externally.

In another embodiment, shown in FIG. 5B, the pull-down driver circuit 500 includes multiple legs 502a-502c coupled in parallel between the I/O pad 506 and circuit ground. The pull-down transistors 504 in each of these legs can be independently turned on during normal operation of the pull-down circuit 504 by application of an appropriate pull-down signal, shown here as pd_n<0> to pd_n<2>, from the logic pre-driver. Additionally, as in the embodiment of FIG. 5A described above, in each leg 502a-502c a second NMOS transistor 508 is coupled between the gate of the pull-down transistor 504 and circuit ground to drive the gate of the NMOS pull-down transistor low enough that any coupling from the I/O PAD does not turn on the pull-down transistors 504 sufficiently to cause excessive I/O leakage that could otherwise occur when the PAD voltage is being driven high externally.

Optionally, in some embodiments the pull-down circuit 500 includes multiple staggered legs 502a-502c having increasing or unequal sizes or pull-down capabilities or impedance. For example in the embodiment shown in FIG. 5B the first of the multiple legs, leg 502a, further includes a resistance element 510 in series with the pull-down transistor 504 to implement slew-rate control. This is shown as optionally implemented for a single leg and hence does not affect any other parameter during normal (non-over-voltage) operation, such as slew-rate control. It has been found that a pull-down circuit including multiple staggered legs according to the present disclosure can decrease an I²C pad distortion due to pad loading by up to about 20%. Since the pghs_h signal is asserted during over-voltage conditions on the pad, the transistors 508 are used to drive the gates of associated pull-down transistors 504 low enough that any coupling from the I/O PAD does not turn on the pull-down transistors sufficiently to cause excessive I/O leakage that could otherwise occur when the PAD voltage is being driven high externally.

Figure 6:
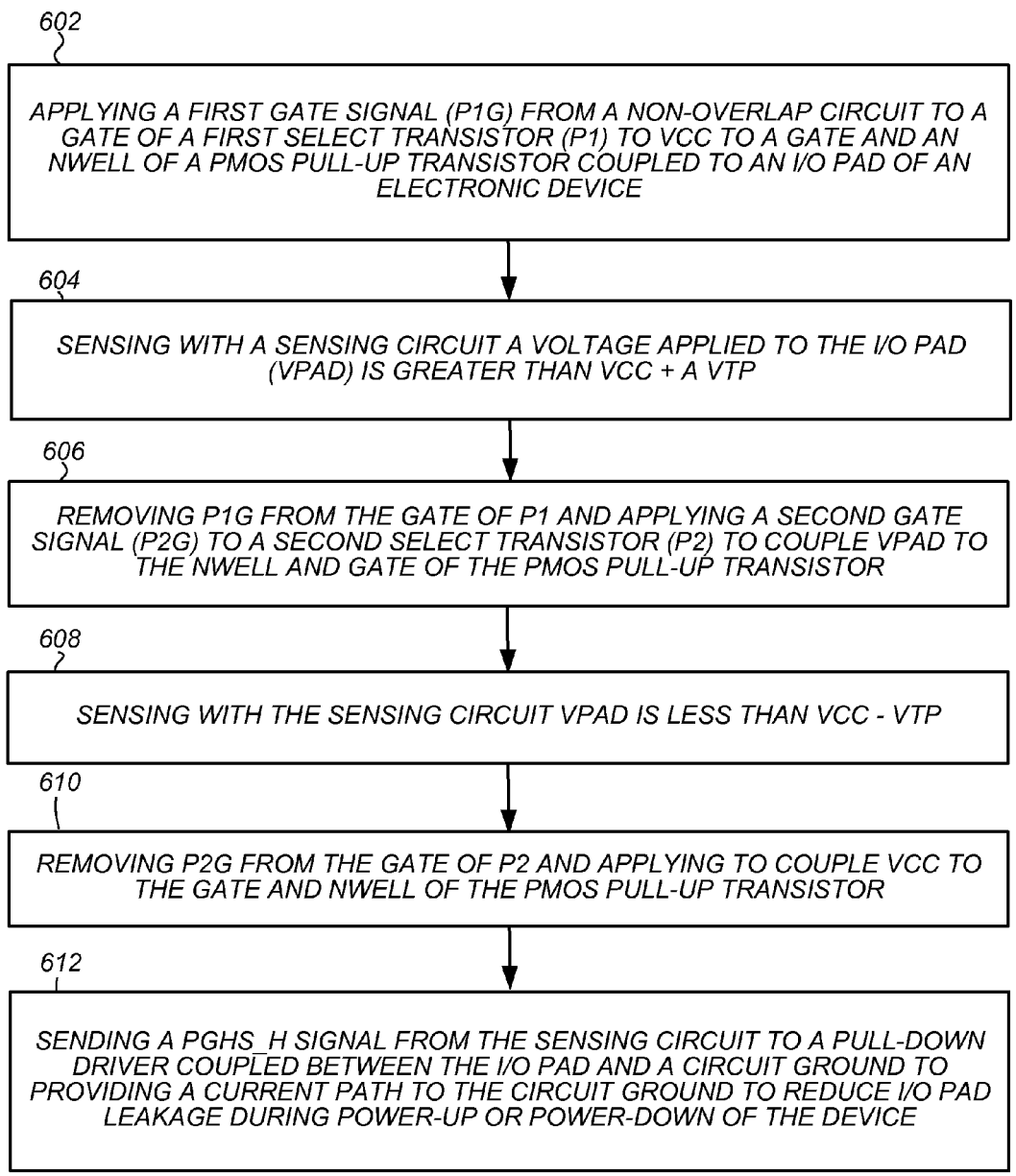
FIG. 6 is a flowchart illustrating an embodiment of a hot-swap method according to the present disclosure.

A method using an over-voltage tolerant circuit including a non-overlap circuit and a pull-down driver according to embodiments of the present disclosure will now be described with reference to the flowchart of FIG. 6. Referring to FIG. 6 the method begins with applying a first gate signal (P1g) from a non-overlap circuit to a gate of a first select transistor (P1) to couple a supply voltage (Vcc) to an N-well and, indirectly, a gate of a PMOS pull-up transistor coupled to an I/O pad of an electronic device (step 602). A sensing circuit then senses a voltage applied to the I/O pad (Vpad) is greater than Vcc+a threshold voltage of the PMOS pull-up transistor (Vtp) (step 604). Next, the first gate signal (P1g) is removed from the gate of the first select transistor (P1) and applying a second gate signal (P2g) to a second select transistor (P2) to couple Vpad to the gate and N-well of the PMOS pull-up transistor (step 606). When the sensing circuit senses Vpad is less than Vcc−Vtp (step 608), the second gate signal (P2g) is removed from the gate of the second select transistor (P2) and applies P1g to couple Vcc to the gate and N-well of the PMOS pull-up transistor (step 610). As noted above, the time between removing the second gate signal (P2g) from the gate of the second select transistor (P2) and applying to couple Vcc to the N-well and, indirectly, the gate of the PMOS pull-up transistor, while not instantaneous is less than about 10 ns.

Optionally, where the over-voltage tolerant circuit further includes a pull-down driver according to the present disclosure coupled between the I/O pad and a circuit ground, the method further includes sending a pghs_h signal from the sensing circuit to the pull-down driver, and providing a current path to the circuit ground through the pull-down driver to reduce I/O pad leakage during power-up or power-down of the device (step 612).

While the discussion has described a sense circuit operating with thresholds of PMOS devices, for transitions at Vcc+Vtp and Vcc−Vtp, alternative approaches may be used to accomplish the same purpose with different sensing mechanisms and sense points. For example, one or more comparators may be used to sense voltages that are closer to Vcc, such as Vcc+100 mV and Vcc−100 mV to reduce the voltage difference between the two sense points. In addition, the sense points may both occur above Vcc, such as at Vcc+200 mV and Vcc+100 mV. In another embodiment, a single sense point may be used, such as at Vcc+100 mV.

Thus, embodiments of over-voltage tolerant circuits and methods have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

What is claimed is:

1. A circuit comprising:
   a pull-up transistor coupled to an I/O pad of an electronic device;
   a sensing circuit coupled to the I/O pad and to a voltage supply (Vcc), the sensing circuit configured to sense a voltage applied to the pad (Vpad);
   a latch coupled to the sensing circuit and configured to retain an output of the sensing circuit; and
   a selection circuit coupled to the sensing circuit through the latch, the selection circuit comprising:
      a first bias circuit to apply Vcc to a well and gate of the pull-up transistor, and a second bias circuit to apply Vpad to the gate and the well of the pull-up transistor; and
      a non-overlap circuit configured to ensure the gate and the well of the pull-up transistor is substantially always driven by either the first or the second bias circuit depending on the output of the sensing circuit.

2. The circuit of claim 1, wherein the pull-up transistor comprises a P-type MOS (PMOS) transistor fabricated in an N-Well.

3. The circuit of claim 1, wherein the output of the sensing circuit coupled to the selection circuit through the latch comprises a gate hot-swap (pghs_h) signal.

4. The circuit of claim 3, wherein the circuit further comprises a pull-down driver including a leg coupled between the I/O pad and a circuit ground, the pull-down driver configured to receive the pghs_h signal and to reduce I/O pad leakage during power-up or power-down.

5. The circuit of claim 4, wherein the pull-down driver comprises a plurality of legs coupled in parallel between the I/O pad and the circuit ground, each leg comprising a N-type MOS (NMOS) pull-down transistor.

6. The circuit of claim 5, wherein the plurality of legs comprises a plurality of staggered legs of increasing pull-down capability.

7. The circuit of claim 5, wherein the plurality of legs comprises at least one leg having a transistor coupled between a gate of the NMOS pull-down transistor and the circuit ground, the transistor configured to receive the pghs_h signal and to drive the gate of the NMOS pull-down transistor low reducing current leakage from the I/O pad during power-up or power-down of the electronic device.

8. The circuit of claim 7, wherein the plurality of staggered legs comprises at least one weak leg having a resistance in series with the NMOS pull-down transistor to implement slew-rate control.

9. A circuit comprising:
   a sensing circuit coupled to an I/O pad of an electronic device and to a voltage supply (Vcc), the sensing circuit configured to sense a voltage applied to the pad (Vpad);
   a latch coupled to the sensing circuit and configured to retain an output of the sensing circuit; and
   a pull-down driver coupled between the I/O pad and a circuit ground, the pull-down driver configured to receive a gate hot-swap (pghs_h) signal from the sensing circuit through the latch and to reduce I/O pad leakage,
   wherein the pull-down driver comprises a plurality of legs of increasing pull-down capability coupled in parallel between the I/O pad and the circuit ground, each leg comprising a N-type MOS (NMOS) pull-down transistor, including at least one weak leg having a resistance in series with the NMOS pull-down transistor to implement slew-rate control.

10. The circuit of claim 9, wherein the plurality of legs comprises at least one strong leg having a transistor coupled between a gate of the NMOS pull-down transistor and the circuit ground, the transistor configured to receive the pghs_h signal and to drive the gate of the NMOS pull-down transistor low reducing current leakage from the I/O pad during power-up or power-down of the electronic device.

11. The circuit of claim 9, further comprising a selection circuit coupled to the sensing circuit through the latch, the selection circuit comprising:
   a first bias circuit to apply Vcc to a well and a gate of a pull-up transistor coupled to the I/O pad of the electronic device, and a second bias circuit to apply Vpad to the gate and the well of the pull-up transistor; and
   a non-overlap circuit configured to ensure the gate and the well of the pull-up transistor is driven by either the first or the second bias circuit depending on the output of the sensing circuit.

12. The circuit of claim 11, wherein the pull-up transistor comprises a P-type MOS (PMOS) transistor fabricated in an N-Well.

13. A method comprising:
   applying a first gate signal (P1g) from a non-overlap circuit to a gate of a first select transistor (P1) to couple a supply voltage (Vcc) to a gate and an N-well of a PMOS pull-up transistor coupled to an I/O pad of an electronic device;
   sensing with a sensing circuit a voltage applied to the I/O pad (Vpad) is greater than Vcc+a threshold voltage of the PMOS pull-up transistor (Vtp);
   removing the first gate signal (P1g) from the gate of the first select transistor (P1) and applying a second gate signal (P2g) to a second select transistor (P2) to couple Vpad to the gate and N-well of the PMOS pull-up transistor;

sensing with the sensing circuit that Vpad is less than Vcc−Vtp; and removing the second gate signal (P2g) from the gate of the second select transistor (P2) and applying the first gate signal (P1g) from the non-overlap circuit to the first select transistor (P1) to couple Vcc to the gate and N-well of the PMOS pull-up transistor.

14. The method of claim 13, further comprising sending a p-gate hot-swap (pghs_h) signal from the sensing circuit to a pull-down driver coupled between the I/O pad and a circuit ground, and providing a current path to the circuit ground through the pull-down driver to reduce I/O pad leakage during power-up or power-down of the device.

15. The method of claim 14, wherein the pull-down driver comprises a plurality of legs coupled in parallel between the I/O pad and the circuit ground, each leg comprising a N-type MOS (NMOS) pull-down transistor.

16. The circuit of claim 15, wherein the plurality of legs comprises a plurality of staggered legs of increasing pull-down capability.

17. The method of claim 16, wherein the plurality of staggered legs comprises at least one strong leg having an NMOS transistor coupled between a gate of the NMOS pull-down transistor and the circuit ground, and wherein providing a current path to the circuit ground through the pull-down driver comprises applying the pghs_h signal to a gate of the NMOS transistor to drive the gate of the NMOS pull-down transistor low reducing leakage current from the I/O pad during power-up or power-down of the electronic device.

* * * * *